(12) United States Patent
Veerasamy

(10) Patent No.: US 8,283,041 B2
(45) Date of Patent: *Oct. 9, 2012

(54) METHOD OF MAKING SCRATCH RESISTANT COATED GLASS ARTICLE INCLUDING LAYER(S) RESISTANT TO FLUORIDE-BASED ETCHANT(S)

(75) Inventor: Vijayen S. Veerasamy, Ann Arbor, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 340 days.

This patent is subject to a terminal disclaimer.

(21) Appl. No.: 12/457,820

(22) Filed: Jun. 23, 2009

(65) Prior Publication Data

US 2009/0263667 A1    Oct. 22, 2009

Related U.S. Application Data

(60) Division of application No. 11/120,180, filed on May 3, 2005, now Pat. No. 7,566,481, and a continuation-in-part of application No. 10/989,721, filed on Nov. 17, 2004, now Pat. No. 7,879,202, and a continuation-in-part of application No. 10/899,305, filed on Jul. 27, 2004, now Pat. No. 7,445,273.

(60) Provisional application No. 60/529,624, filed on Dec. 16, 2003, provisional application No. 60/529,103, filed on Dec. 15, 2003.

(51) Int. Cl.
*B32B 9/00* (2006.01)

(52) U.S. Cl. ......... 428/432; 428/697; 428/698; 428/699

(58) Field of Classification Search .................. 428/433, 428/432, 697, 698, 699, 701, 702

See application file for complete search history.

(56) References Cited

U.S. PATENT DOCUMENTS

| | | | |
|---|---|---|---|
| 3,885,855 A | 5/1975 | Gross | |
| 4,353,885 A | 10/1982 | Hoekje | |
| 4,568,578 A * | 2/1986 | Arfsten et al. | 428/432 |
| 4,758,280 A * | 7/1988 | Bergmann et al. | 428/472 |
| 4,900,634 A * | 2/1990 | Terneu et al. | 428/432 |
| 5,112,675 A | 5/1992 | Wuest et al. | |
| 5,122,252 A * | 6/1992 | Latz et al. | 204/298.26 |

(Continued)

FOREIGN PATENT DOCUMENTS

EP    0 636 702    2/1995

(Continued)

OTHER PUBLICATIONS

U.S. Appl. No. 11/120,180, filed May 3, 2005; Veerasamy.

(Continued)

*Primary Examiner* — Archene Turner
(74) *Attorney, Agent, or Firm* — Nixon & Vanderhye P.C.

(57) ABSTRACT

A method is provided for making a coated article including an anti-etch layer(s) that is resistant to attacks by at least some fluoride-based etchant(s) for at least a period of time. In certain example embodiments, an anti-etch layer(s) is provided on a glass substrate in order to protect the glass substrate from attacks by fluoride-based etchant(s). In certain example embodiments, the anti-etch layer(s) is formed using at least one ion beam (possibly in combination with at least one sputtering target). In certain embodiments, a diamond-like carbon (DLC) inclusive layer(s) may be provided over and/or under the anti-etch layer.

8 Claims, 3 Drawing Sheets

U.S. PATENT DOCUMENTS

| | | | |
|---|---|---|---|
| 5,268,217 A * | 12/1993 | Kimock et al. | 428/698 |
| 5,618,389 A | 4/1997 | Kreider | |
| 5,635,245 A | 6/1997 | Kimock et al. | |
| 5,643,423 A | 7/1997 | Kimock et al. | |
| 5,846,649 A * | 12/1998 | Knapp et al. | 428/448 |
| 5,888,593 A * | 3/1999 | Petrmichl et al. | 427/563 |
| 5,928,977 A * | 7/1999 | Magnin et al. | 428/698 |
| 5,935,735 A | 8/1999 | Okubo et al. | |
| 5,942,331 A | 8/1999 | Miyauchi et al. | |
| 5,959,762 A * | 9/1999 | Bandettini et al. | 359/265 |
| 6,002,208 A | 12/1999 | Maishev et al. | |
| 6,114,043 A * | 9/2000 | Joret | 428/697 |
| 6,132,889 A * | 10/2000 | Welty et al. | 428/623 |
| 6,261,693 B1 | 7/2001 | Veerasamy | |
| 6,280,834 B1 | 8/2001 | Veerasamy et al. | |
| 6,284,377 B1 | 9/2001 | Veerasamy | |
| 6,291,054 B1 | 9/2001 | Thomas et al. | |
| 6,303,225 B1 | 10/2001 | Veerasamy | |
| 6,303,226 B2 | 10/2001 | Veerasamy | |
| 6,335,086 B1 | 1/2002 | Veerasamy | |
| 6,338,901 B1 | 1/2002 | Veerasamy | |
| 6,359,388 B1 | 3/2002 | Petrmichl | |
| 6,368,664 B1 | 4/2002 | Veerasamy et al. | |
| 6,395,333 B2 | 5/2002 | Veerasamy | |
| 6,447,891 B1 | 9/2002 | Veerasamy et al. | |
| 6,461,731 B1 | 10/2002 | Veerasamy et al. | |
| 6,592,992 B2 | 7/2003 | Veerasamy | |
| 6,632,762 B1 | 10/2003 | Zaykoski et al. | |
| 6,669,871 B2 | 12/2003 | Kwon et al. | |
| 6,686,050 B2 | 2/2004 | Lingle et al. | |
| 6,689,475 B1 | 2/2004 | Lin | |
| 6,713,178 B2 | 3/2004 | Veerasamy | |
| 6,713,179 B2 | 3/2004 | Veerasamy | |
| 6,716,532 B2 | 4/2004 | Neuman et al. | |
| 6,723,211 B2 | 4/2004 | Lingle et al. | |
| 6,756,119 B1 | 6/2004 | Clough | |
| 6,793,979 B2 | 9/2004 | Veerasamy | |
| 7,264,668 B2 * | 9/2007 | Lau et al. | 106/286.1 |
| 7,270,895 B2 * | 9/2007 | Anton | 428/701 |
| 7,396,408 B2 * | 7/2008 | Schreck et al. | 117/68 |
| 7,445,273 B2 | 11/2008 | Veerasamy et al. | |
| 7,476,302 B2 * | 1/2009 | Choi et al. | 204/192.33 |
| 7,566,481 B2 | 7/2009 | Veerasamy | |
| 7,824,772 B2 * | 11/2010 | Thomsen et al. | 428/432 |
| 2001/0044030 A1 | 11/2001 | Veerasamy et al. | |
| 2001/0051273 A1 | 12/2001 | Veerasamy | |
| 2003/0170464 A1 | 9/2003 | Veerasamy | |
| 2003/0194616 A1 | 10/2003 | Carcia et al. | |
| 2004/0115343 A1 | 6/2004 | Carcia et al. | |
| 2005/0178652 A1 | 8/2005 | Murphy et al. | |

FOREIGN PATENT DOCUMENTS

| | | | |
|---|---|---|---|
| GB | 1 354 726 | | 5/1974 |
| GB | 1598924 | * | 9/1981 |
| JP | 08-104546 | | 4/1996 |
| WO | WO 2005/115941 | | 12/2005 |

OTHER PUBLICATIONS

Yang Meng et al., Molybdenum-doped indium oxide transparent conductive thin film; J. Vac. Sci Technogy A 20(1); pp. 288-290; Jan. 2002.

U.S. Appl. No. 60/529,624, filed Dec. 16, 2003.

U.S. Appl. No. 60/529,103, filed Dec. 15, 2003.

U.S. Appl. No. 10/989,721, filed Nov. 17, 2004; Murphy et al.

* cited by examiner

METHOD OF MAKING SCRATCH RESISTANT COATED GLASS ARTICLE INCLUDING LAYER(S) RESISTANT TO FLUORIDE-BASED ETCHANT(S)

This application is a divisional of application Ser. No. 11/120,180, filed May 3, 2005, now U.S. Pat No. 7,566,481 which claims priority on U.S. Provisional Patent Application No. 60/529,624, filed Dec. 16, 2003, and 60/529,103, filed Dec. 15, 2003, and furthermore this application is a continuation-in-part (CIP) of each of U.S. Patent Application No. 10/989,721, filed Nov. 17, 2004, now U.S. Pat. No. 7,879,202 and 10/899,305, filed Jul. 27, 2004, now U.S. Pat. No. 7,445,273, the entire disclosures of which are all hereby incorporated herein by reference.

This application relates to a coated article including a coating supported by a glass substrate, and a method of making the same. The coating includes an anti-etch layer that is resistant to fluoride-based etchant(s), and may also include other layer(s) such as a scratch-resistant layer comprising diamond-like carbon (DLC). Coated articles according to different embodiments of this invention may be used as windows or in any other suitable application.

BACKGROUND OF THE INVENTION

Unfortunately, vandals have increasingly been turning to glass etchants as a tool of choice for graffiti. For example, graffiti on glass windows of subway cars is commonplace. Vandals have been forming such graffiti on windows of subway cars, buildings, trains, buses and other glass windows by using glass etchants which are capable of etching glass at locations where such etchants are applied.

Armor-etch is an example of a bifluoride salt (e.g., ammonia bifluoride or sodium bifluoride) based paste used for etching patterns on glass surfaces, and has been used in forming graffiti. The mechanism of fluoride ion attack on $SiO_2$ of glass is summarized below for purposes of example only and understanding.

Though hydrogen fluoride (HF) does not dissociate well, active hydrogen fluoride paste reacts with silicate (which forms the matrix for glass) in the presence of water as in the following equations:

$$HF_2^- = HF + F^-$$

$$6HF + SiO_2 = H_2SiF_6 + 2H_2O$$

An alternative type of glass etching material, which is also a bi-fluoride based etchant, is sometimes referred to as B&B etching crème manufactured by B&B Etching Products. Ammonium bifluoride $((NH_4)HF_2)$ and sodium bifluoride $(NaHF_2)$ salts are very soluble in water. For example, a 2.8 g/100 g solution of ammonium fluoride would produce a 1.7 g/100 g solution of hydrofluoric acid (HF) at pH 1, with 85% of the fluorine atoms in the form of HF. At higher concentrations or higher pH, a significant amount of the $HF_2^-$ ion is present. Acidified fluorides can produce substantial quantities of HF in solution.

The active ammonia bi-fluoride reacts with silicate in the presence of water as presented in the following equations:

$$(NH_4)HF_2 = (NH_4)^+ + HF_2^-$$

$$HF_2^- = HF + F^-$$

$$6HF + SiO_2 = H_2SiF_6 + 2H_2O$$

An equilibrium is established between the reactants and products. Thus, as hydrogen fluoride is consumed in reacting with the $SiO_2$ of the glass, more hydrogen fluoride is produced to maintain the equilibrium. The $SiO_2$ etch rate (i.e., the etch rate of the glass) is linearly related to the $HF^-$ and $HF_2^-$ concentrations, and is not related to the $F^-$ concentration at any pH.

Conventional coatings used for fluoride resistance to protect glass from such etchings are polymer-based film. Unfortunately, these coatings are susceptible to damage and are not very scratch resistant thereby rendering their use in environments such as subway cars, buses and vehicles undesirable. Moreover, in some cases the film can be lifted and the etchant applied under the film.

Scratch resistant coated glass articles are known which utilize a layer(s) comprising diamond-like carbon (DLC) on the glass surface. For example, see U.S. Pat. Nos. 6,261,693, 6,303,226, 6,280,834, 6,284,377, 6,447,891, 6,461,731, 6,395,333, 6,335,086, and 6,592,992, the disclosures of which are all hereby incorporated herein by reference. While carbon is resistant to fluoride ion (and $HF_2^-$) attack, these layers when formed via ion beam deposition techniques at very small thicknesses give rise to micro-particulates on the substrate. When such layers are very thin in nature, these micro-particles may give rise to pinholes which are pathways for the HF to attack the underlying glass. Thus, scratch resistant coated articles which utilize only a layer comprising DLC on the glass are sometimes susceptible to the fluoride based etchant attacks described above.

In view of the above, it can be seen that there exists a need in the art for a scratch resistant coated article which is also resistant to attacks by fluoride-based etchant(s), and for a method of making the same.

BRIEF SUMMARY OF EXAMPLES OF THE INVENTION

A scratch resistant coated article is provided which is also resistant to attacks by at least some fluoride-based etchant(s) for at least a period of time. In certain example embodiments, an anti-etch layer(s) is provided on the glass substrate in order to protect the glass substrate from attacks by fluoride-based etchant(s). In certain example embodiments, the anti-etch layer(s) is substantially transparent to visible light.

Surprisingly, it has been found that the use of an ion beam(s) in depositing an anti-etch layer(s) results in a layer that is more resistant to attacks by fluoride-based etchant(s). For example and without limitations, anti-etch films grown at approximately room temperature using at least an ion beam (possibly in combination with a sputtering target(s)) have been found to be more resistant to HF acid exposure than their purely sputtered counterparts. The ion beam source (along with an optional sputtering target(s)) may be located either above or below the substrate during the deposition process.

In certain example embodiments, an underlayer(s) may be provided under the anti-etch layer(s). The underlayer may comprise diamond-like carbon (DLC) or some other dielectric in different example embodiments of this invention. In certain example instances, the underlayer may also be formed using at least an ion beam(s).

In certain example embodiments of this invention, there is provided a method of making a coated article, the method comprising: providing a glass substrate; and forming an anti-etch layer on the substrate that is resistant to attacks by fluoride-based etchant(s) using each of at least one sputtering target and at least one ion source so that ions in an ion beam from the ion source impinge on a layer-forming surface along with material sputtered from the sputtering target.

In certain example embodiments of this invention, the anti-etch layer may comprise one or more of: silicon carbide nitride, hydrogenated silicon carbide nitride, zirconium oxycarbide, zirconium carbide, hydrogenated zirconium oxycarbide, hydrogenated zirconium carbide, tin oxycarbide nitride, indium oxide, indium molybdenum oxide, cerium oxide, indium tin oxide, and/or magnesium oxide.

In other example embodiments of this invention, there is provided a window comprising: a glass substrate, and a coating supported by the glass substrate; wherein the coating comprises a first layer located directly on an contacting the substrate, and an anti-etch layer located over and contacting the first layer, wherein the anti-etch layer comprises one or more of: silicon carbide nitride, hydrogenated silicon carbide nitride, zirconium oxycarbide, zirconium carbide, hydrogenated zirconium oxycarbide, hydrogenated zirconium carbide, tin oxycarbide nitride, indium oxide, indium molybdenum oxide, cerium oxide, indium tin oxide, and/or magnesium oxide.

In other example embodiments of this invention, there is provided a method of making a coated article, the method comprising: providing a glass substrate; forming a dielectric layer on the glass substrate; forming an anti-etch layer on the glass substrate over at least the dielectric layer, wherein the anti-etch layer comprises one or more of: (a) cerium oxide and (b) indium molybdenum oxide; and using an ion source to form a layer comprising diamond-like carbon over and contacting the anti-etch layer. The anti-etch layer may be deposited via sputtering (e.g., RF sputtering) or the like in certain example embodiments of this invention.

DETAILED DESCRIPTION OF EXAMPLE EMBODIMENTS OF THE INVENTION

Figure 1:
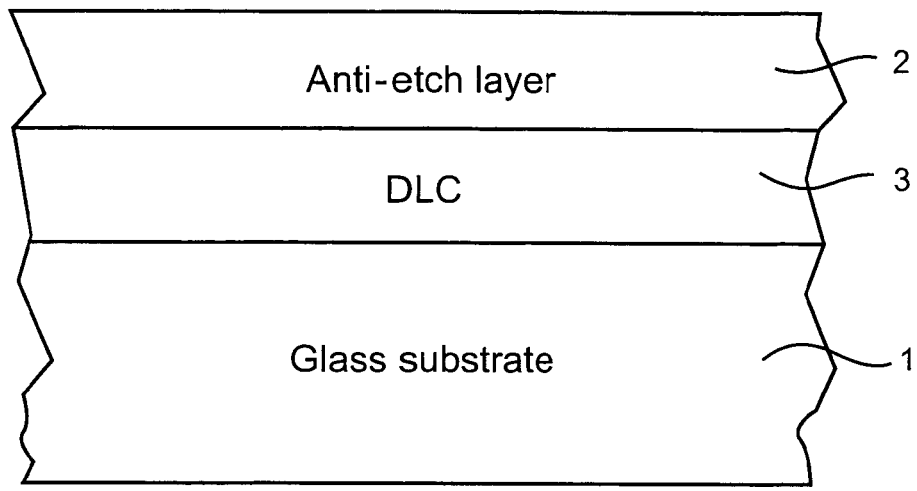
FIG. 1 is a cross sectional view of a coated article according to an example embodiment of this invention.

Referring now more particularly to the accompanying drawings in which like reference numerals indicate like parts/layers throughout the several views.

Coated articles according to certain example embodiments of this invention may be used as subway car windows, transit bus windows, train windows, or other types of vehicle windows, or the like in different applications. Coated articles according to certain example embodiments of this invention may also be used as architectural windows, in monolithic or IG unit form. Coated articles such as windows according to certain example embodiments of this invention may have a visible transmission of at least about 15%, more preferably at least about 30%, more preferably of at least about 50%, and even more preferably of at least about 70%. In certain example embodiments of this invention, any of the coated articles discussed herein may or may not be heat treated (e.g., thermally tempered).

A scratch resistant coated article is provided which is also resistant to attacks by fluoride-based etchant(s). In certain example embodiments, an anti-etch layer(s) is provided on the glass substrate in order to protect the glass substrate from attacks by fluoride-based etchant(s). In certain example embodiments, the anti-etch layer(s) is substantially transparent to visible light (i.e., the anti-etch layer if deposited alone would be transmissive to at least about 60% of visible light, more preferably at least about 70% of visible light, and even more preferably at least about 80% of visible light).

In certain example embodiments of this invention, single or multi-layer coatings according to example embodiments of this invention are able to resist HF attack on glass for twenty-four hours or so with no visible sign of significant adverse effect. In example embodiments of this invention, such coatings have a dense structure, are characterized by low pinhole density, and/or are characterized by substantial chemical inertness (e.g., forming insoluble fluorides).

Surprisingly, it has been found that the use of an ion beam(s) in depositing an anti-etch layer(s) results in a layer that is more resistant to attacks by fluoride-based etchant(s). For example and without limitations, anti-etch films grown at approximately room temperature using at least an ion beam (possibly in combination with a sputtering target(s)) have been found to be more resistant to HF acid exposure than their purely sputtered counterparts. The ion beam source (along with an optional sputtering target(s)) may be located either above or below the substrate during the deposition process.

In certain example embodiments, the thickness of the anti-etch layer need not exceed about 0.9 μm (or 9,000 Å). In certain example embodiments, the thickness of each anti-etch layer(s) may be from about 50 to 9,000 Å, more preferably from about 100-5,000 Å. In certain preferred instances, each anti-etch layer is preferably at least about 1,000 Å thick, and still more preferably from about 1200 to 5,000 Å thick. It is noted however that t is possible for the anti-etch layer to be thicker (e.g., from 9,000 to 20,000 Å) in certain instances.

FIG. 1 is a cross sectional view of a coated article according to an example embodiment of this invention. The coated article includes a glass substrate 1 (e.g., soda lime silica glass, or borosilicate glass which may or may not be polished) which supports both an anti-etch layer 2 and optionally a layer of or including diamond-like carbon (DLC) 3 provided over and possibly contacting the anti-etch layer 2. In certain alternative embodiments of this invention, another DLC inclusive layer 3 may be provided under the anti-etch layer 2 in the FIG. 1 embodiment.

Any layer 3 (or 3' or 3" herein) of or including DLC may be any of the DLC inclusive layers described in one or more of U.S. Pat. Nos. 6,261,693, 6,303,226, 6,280,834, 6,284,377, 6,447,891, 6,461,731, 6,395,333, 6,335,086, and/or 6,592,992, and may be deposited/formed in any of the manners described in any of these patents, the disclosures of which are all incorporated herein by reference. For example, and without limitation, DLC inclusive layer 3 may be from about 5 to 3,000 angstroms (Å) thick in certain example embodiments of this invention, more preferably from 10-300 Å thick, and even more preferably from about 50-200 Å thick.

In certain example embodiments of this invention, layer 3 (or 3' or 3") including DLC may have an average hardness of at least about 10 GPa, more preferably at least about 20 GPa, and most preferably from about 20-90 GPa. Such hardness renders layer (s) 3 resistant to scratching, certain solvents, and/or the like. Layer 3 (or 3' or 3") may, in certain example embodiments, be of or include a special type of DLC known as highly, tetrahedral amorphous carbon (t-aC), and may be hydrogenated (t-aC:H) in certain embodiments (e.g., from 5 to 39% hydrogen, more preferably from 5 to 25% hydrogen, and most preferably from 5 to 20% hydrogen). This type of DLC includes more sp³ carbon-carbon (C—C) bonds than sp² carbon-carbon (C=C) bonds. In certain example embodiments, at least about 50% of the carbon-carbon bonds in the layer 3 may be sp³ carbon-carbon (C—C) bonds, more preferably at least about 60% of the carbon-carbon bonds in the layer 3 may be sp³ carbon-carbon (C—C) bonds, and most preferably at least about 70% of the carbon-carbon bonds in the layer 3 may be sp³ carbon-carbon (C—C) bonds. In certain example embodiments of this invention, the DLC inclusive layer 3 (or 3' or 3") may have a density of at least about 2.4 gm/cm³, more preferably of at least about 2.7 gm/cm³. Example linear ion beam sources that may be used to deposit DLC inclusive layer 3 (or 3' or 3") on substrate 1 over and/or under anti-etch layer 2 via an ion beam include any of those in any of U.S. Pat. Nos. 6,359,388, 6,261,693, 6,002,208, 6,335,086, 6,303,226, or 6,303,225 (all incorporated herein by reference). When using an ion beam source to deposit layer(s) 3 (or 3' or 3"), hydrocarbon feedstock gas(es) (e.g., $C_2H_2$), HMDSO, or any other suitable gas, may be used in the ion beam source in order to cause the source to emit an ion beam toward substrate 1 for forming DLC inclusive layer(s) 3. It is noted that the hardness and/or density of layer(s) 3 may be adjusted by varying the ion energy of the depositing apparatus. The use of DLC inclusive layer 3 allows the coated article (e.g., monolithic window, or IG unit) to be more scratch resistant than if the coating were not provided.

In certain example embodiments of this invention, the glass substrate 1 may be ion beam milled before the anti-etch layer 2 is deposited thereon. The ion beam milling of the glass substrate has been found to remove certain defects on the glass surface thereby resulting in a more durable end product. For example and without limitation, any of the example techniques of ion beam milling described in U.S. Pat. No. 6,368,664 may be used to ion beam mill the glass substrate 1 in this regard, the disclosure of the '664 patent being incorporated herein by reference. In the FIG. 1 embodiment for example, after ion beam milling the glass substrate (e.g., to remove at least about 2 Å of glass from the substrate, more preferably at least about 5 Å, and possibly at least about 10 Å), the anti-etch layer 2 may be deposited using ion beam assisted deposition (IBAD) in different embodiments of this invention. Thereafter, the DLC inclusive layer 3 may be ion beam deposited over the anti-etch layer 2. Stack configurations may be produced by one-pass in-line deposition in a suitably configured system, or in any other suitable manner.

Anti-etch layer(s) 2 is provided to allow the coated article to be resistant to attacks by fluoride-based etchant(s) such as those discussed above. The anti-etch layer 2 may be deposited ion beam deposition or ion beam assisted deposition (IBAD) in different embodiments of this invention. Anti-etch layer 2 substantially prevents (or reduces) fluoride-based etchant(s) such as those discussed above from reaching the glass substrate 1 for at least a period of time (e.g., for at least one hour, more preferably for at least twelve hours, and most preferably for at least twenty-four hours), thereby rendering the coated article more resistant to attacks by fluoride-based etchant(s) such as those discussed above. Moreover, since certain embodiments of this invention are used in the context of window applications, the anti-etch layer(s) 2 is substantially transparent to visible light. As explained above, it has been found that the etch resistance of the article is improved when an ion beam is used in depositing anti-etch layer(s) 2 (e.g., via IBAD).

Moreover, it has been found that the inclusion of carbon into an inorganic anti-etch layer 2 or coating significantly improves the resistance of the coated glass article to corrosion by fluoride etching. In certain example embodiments, at least carbon inclusive reactive gas (e.g., acetylene ($C_2H_2$) and/or $CO_2$) is used during the deposition process of anti-etch layer 2 in order to provide carbon in the resulting layer 2 thereby improving the corrosion resistance of the layer and the coated article.

In different example embodiments of this invention, the anti-etch layer(s) 2 may comprise or consist essentially of silicon carbide nitride (e.g., $SiC_xN_y$), hydrogenated silicon carbide nitride ($SiC_xN_y$:H), zirconium oxycarbide (e.g., ZrOC), zirconium carbide (ZrC), hydrogenated zirconium oxycarbide (e.g., ZrOC:H), hydrogenated zirconium carbide (e.g., ZrC:H). In still further example embodiments of this invention, the anti-etch layer(s) may comprise or consist essentially of $InO_x$, $InMoO_x$, $CeO_x$, $InO_x/CeO_x$, $InSnO_x$, MgO, or $SnO_xC_yN_z$. These materials are advantageous in that, for example, silicon carbide nitride and zirconium carbide are very scratch resistant, thereby improving the mechanical durability of the coated article in addition to being etch resistant. In this respect, silicon carbide nitride and zirconium carbide (even if it also includes some oxygen) tends to be very hard and durable. In certain example embodiments of this invention, the an example layer 2 (e.g., of or including zirconium carbide) may be formed (e.g., via IBAD) so as to have an average hardness of at least about 20 GPa, more preferably of at least about 25 GPa, still more preferably of at least about 27 GPa, and most preferably of at least about 29 GPa.

Moreover, another advantage associated with these materials is that zirconium carbide for example (whether or not hydrogenated and/or oxided) is fairly resistant to oxidation in environments where it is exposed to UV rays and/or water— this is an improvement over DLC alone in certain example non-limiting embodiments of this invention.

It is further noted that it has surprisingly been found that when the anti-etch layer 2 is formed using IBAD which includes reactive sputtering using a carbon inclusive gas such as $C_2H_2$ plus $O_2$, or $CO_2$ (optionally in addition to Ar gas for example), the resulting coating and coated article realizes significantly improved resistance to fluoride based etching compared to a situation where the layer 2 is reactively deposited using only $O_2$ gas (in addition to Ar). It is believed that the surprisingly improved resistance resulting from the inclusion of carbon in the gas and/or the use of the ion beam assisting.

As mentioned above, the $SiC_xN_y$, ZrC or ZrOC may be hydrogenated in certain example embodiments of this invention. In hydrogenated embodiments, the hydrogen content of the layer may be from about 1-40%, more preferably from about 5-35%, and even more preferably from about 5-25%.

As explained above, when the DLC layer is provided, it is typically deposited by an ion beam technique under and/or over the anti-etch layer 2. In such instances, due to the high energy which may be used in ion beam depositing DLC inclusive layer 3 and/or anti-etch layer 2, the DLC may alloy with the material of the anti-etch layer at the interface(s) between layers 2 and 3. Thus, for example and without limitation, a thin layer comprising an alloy of Zr and DLC may be provided between layers 2 and 3 in certain example embodiments of this invention.

Figure 2:
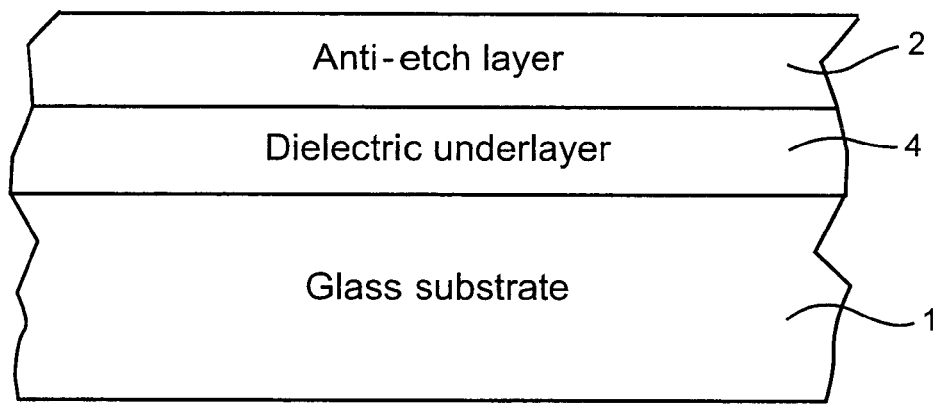
FIG. 2 is a cross sectional view of a coated article according to another example embodiment of this invention.

FIG. 2 illustrates another example embodiment of this invention where an underlayer 4 (e.g., silicon nitride, silicon oxide {e.g., $SiO_2$ or any other suitable stoichiometry}, or silicon oxynitride) is provided between the glass substrate 1 and the anti-etch layer 2 discussed above. Of course, any of the aforesaid anti-etch layers 2 may be used as layer 2 in this FIG. 2 embodiment. In certain example instances, the underlayer 4 (which is preferably a dielectric) has been found to further improve the etch resistance of the coated article by removing or reducing chemical or other defects on the glass surface. In particular, it is believed that the underlayer 4 of silicon oxide for example removes or reduces chemical defects on the surface on which the anti-etch layer is directly provided. Such defects may lead to growth defects in the anti-etch layer 2 which can be weak points more susceptible to etchant attack. Thus, the removal or reduction of such defects via the use of silicon oxide or the like is advantageous in that etch resistance can be surprisingly improved. The silicon oxide or the like of the underlayer 4 may be formed in any suitable manner, such as by magnetron sputtering, IBAD, ion beam deposition, flame pyrolysis (combustion-CVD), etc. An example advantage of combustion-CVD, for example, is that it is an atmospheric pressure process and does not require expensive hardware typically associated with low pressure processes such as sputtering. In certain example embodiments of this invention, any of the aforesaid underlayers 4 may have a thickness of from about 30 to 800 Å, more preferably from about 50 to 500 Å, and most preferably from about 100 to 400 Å.

Figure 3:
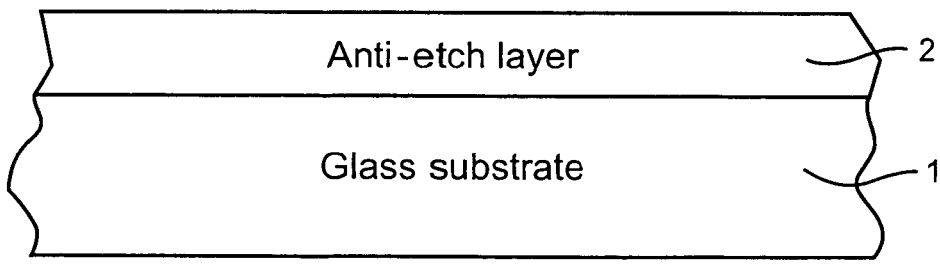
FIG. 3 is a cross sectional view of a coated article according to another example embodiment of this invention.

FIG. 3 illustrates another example embodiment of this invention where the anti-etch layer 2 alone is provided directly on and contacting the glass substrate 1. There need not be any protective layer over the anti-etch layer 2 in this embodiment. Again, any of the aforesaid anti-etch layers 2 may be used as layer 2 in this FIG. 3 embodiment. In other words, the anti-etch layer 2 in the FIG. 2-3 embodiments may be made of or include any of the materials listed above with respect to layer 2 in the FIG. 1 embodiment.

Figure 5:
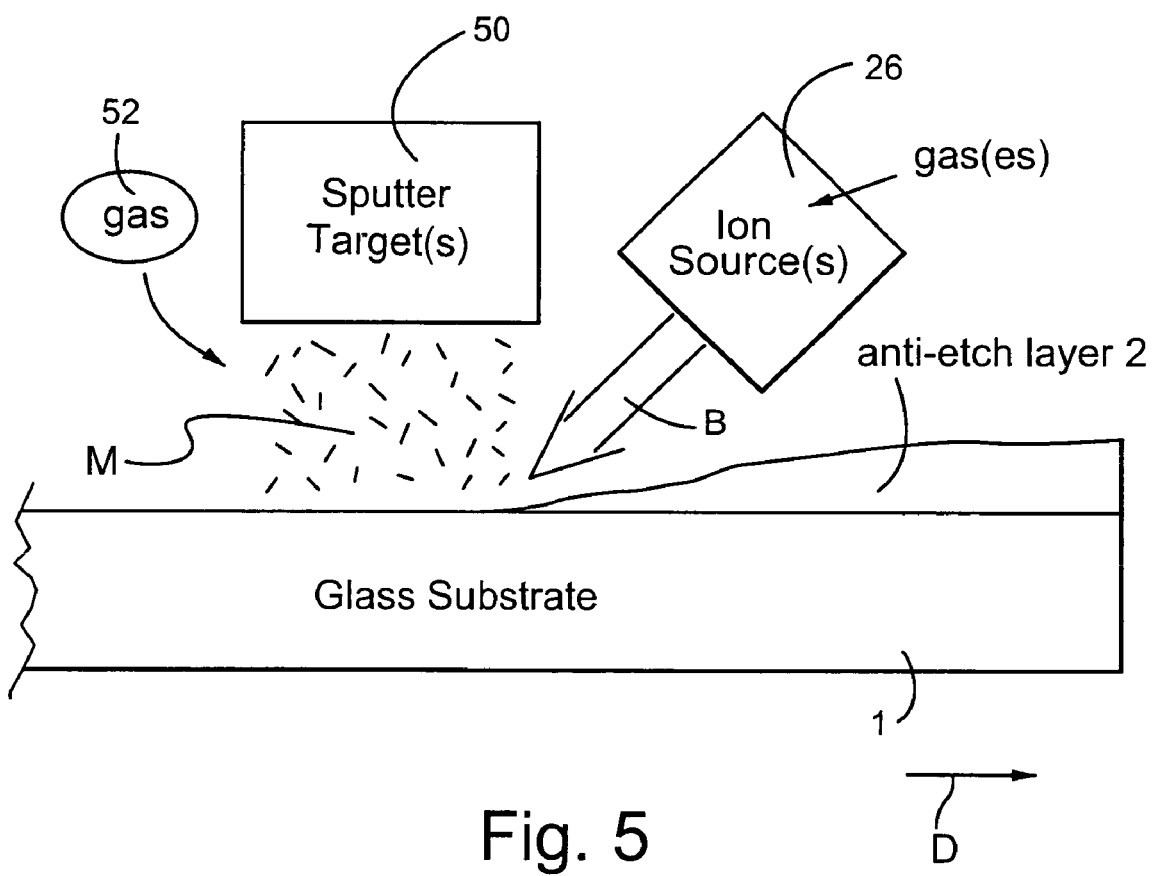
FIG. 5 is a schematic diagram illustrating an example method of depositing and/or forming an anti-etch layer according to an example embodiment of this invention.

Referring to FIG. 5, any anti-etch layer 2 herein may be formed using IBAD in certain example embodiments of this invention. Again, the advantage of using IBAD is that the ion beam(s) used during IBAD layer formation adds energy to the layer formation process and causes a more dense layer 2 to be formed. It is believed that this improves anti-etch characteristics of the layer 2. In an IBAD process, both an ion beam(s) and material from a sputtering target(s) simultaneously impinge on the substrate in order to form the layer 2 being deposited. FIG. 5 illustrates and example of using IBAD to form/deposit anti-etch layer 2. As shown, in this IBAD embodiment both an ion beam source(s) 26 and a sputtering device including a sputtering target(s) 50 are used. An ion beam B from the ion beam source 26 intersects with the material M sputtered from the sputtering target(s) 50 proximate the surface where at least part of the anti-etch layer 2 is being grown (either directly on the substrate or with other layer(s) therebetween), so that at least part of the anti-etch layer 2 is grown/formed by a simultaneous combination of both the ion beam and sputtering. Substrate 1 is preferably moving in direction D during the layer formation process. Gas from source(s) 52 is used proximate the sputtering target 50.

In IBAD embodiments such as shown in FIG. 5, gas including carbon such as gas comprising $C_2H_2$ and/or $CO_2$ may be introduced to a sputtering chamber proximate the sputtering target 50 (e.g., of Zr, Si, Sn or the like) so that the anti-etch layer 2 is formed on (directly or indirectly) the substrate 1. It will be appreciated that when it is desired to hydrogenate the layer, the gas should include hydrogen and may comprise a hydrocarbon gas for example (e.g., $C_2H_2$). In addition to the carbon inclusive gas, gas(es) such as Ar and/or $O_2$ may also be introduced into the sputtering chamber. The sputter zone is typically at a pressure less than atmospheric pressure (e.g., at 2 to 3 mTorr). When ion source(s) 26 is used in the formation process for layer 2, then gas such as Ar and/or $C_2H_2$ may be introduced into the ion source 26 as shown in FIG. 5. In such situations, the ion source 26 may emit ions such as Ar ions, C ions and/or H ions in beam B toward the layer formation area on the substrate. When it is desired to nitride the anti-etch layer 2, nitrogen gas may also be used in the sputter-deposition process (e.g., via gas source 52 or via the ion source) for example in order to at least partially nitride the anti-etch layer 2 in certain embodiments of this invention.

Figure 4:
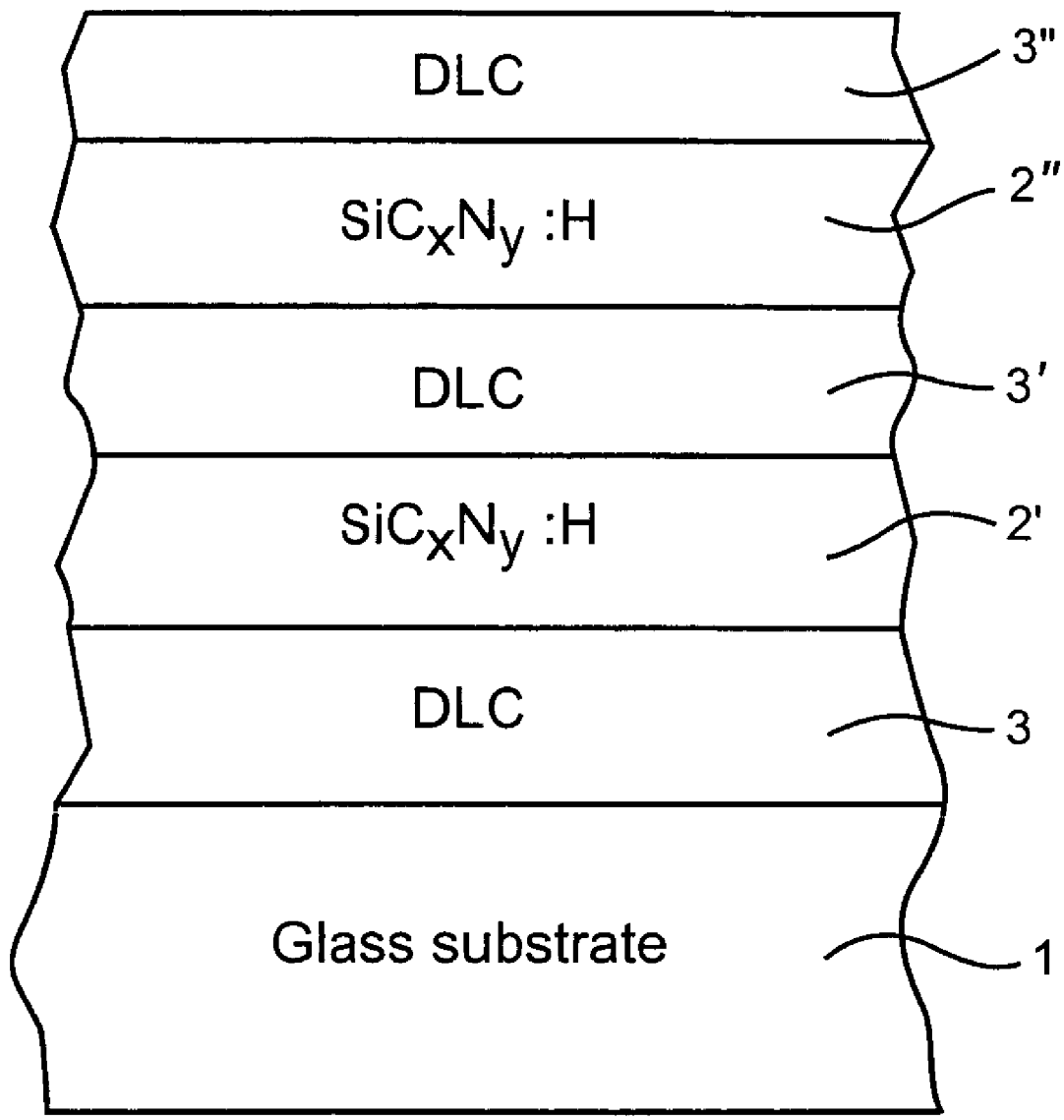
FIG. 4 is a cross sectional view of a coated article according to another example embodiment of this invention.

FIG. 4 is a cross sectional view of a coated article according to yet another example embodiment of this invention. In the FIG. 4 embodiment, two anti-etch layers 2' and 2" comprising or consisting essentially of silicon carbide nitride (e.g., $SiC_xN_y$) and/or hydrogenated silicon carbide nitride ($SiC_xN_y$:H) are provided. Moreover, in the FIG. 4 embodiment, first, second and third layers (3, 3' and 3") comprising DLC (any of the DLC inclusive layers discussed above) are also provided. The DLC inclusive layers 3, 3' and 3" may be deposited via ion beam deposition, whereas anti-etch layers 2' and 2" are deposited via IBAD in certain example embodiments.

EXAMPLES

The following examples are provided for purposes of example only and are not intended to be limiting unless expressly claimed.

In a first example, a hydrogenated silicon carbide nitride ($SiC_xN_y$:H) anti-etch layer 2 was deposited using IBAD over a DLC based layer 3 on a glass substrate 1 (e.g., see FIG. 1). The DLC layer 3 was about 100 angstroms thick, and the anti-etch layer 2 was about 1530-1565 angstroms thick. The glass substrate was 2.3 mm thick. The IBAD conditions used in depositing the anti-etch layer 2 were as follows:

a) Planar SiC sputtering target
b) 0.38 m linear ion source positioned 30 degrees from the horizontal
c) Ar gas flow by the sputtering target=150 sccm
d) Acetylene gas flow through the ion source=20 sccm
e) $NH_3$ gas flow through the ion source=5 sccm
f) Pressure=2.69 mT
g) Magnetron sputtering power of 2.3 kW from 665V and 3.4 A
h) 3 kV voltage for ion source which produced 0.26 A Optical characteristics (transmissive) of the resulting coated article (2 degrees Ill. C) were: Y (visible transmission)=31.88%, L*=63.24, a*=4, and b*=22.32. After 15 minutes of Armour-etch exposure, the sample showed excellent etch resistance, as not much etching had occurred.

In a second group of examples, coatings were formed as shown in FIG. 4. In particular, each coating included the following layers from the substrate outwardly: DLC/$SiC_xN_y$:H/DLC/$SiC_xN_y$:H/DLC. Thus, these coatings of the second example group each included two anti-etch layers 2' and 2" consisting essentially of hydrogenated silicon carbide nitride ($SiC_xN_y$:H), and three layers of hydrogenated DLC (3, 3' and 3"). The two anti-etch layers 2' and 2" were formed using IBAD in the same manner described above with respect to the first example, and the three DLC layers were formed via ion beam deposition with argon and acetylene gas running through the ion source. The DLC layers formed on the $SiC_xN_y$:H were formed using three 900 V DLC passes before four 3000 V DLC passes by the source. Each of the five layers was targeted to be at least 100 angstroms thick. In the second group of examples, such a coating was formed on each of a glass, DLC and silicon dioxide substrate.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. A window for use in a bus, train and/or vehicle, the window comprising:
   a glass substrate, and a coating supported by the glass substrate of the window for use in the bus, train and/or vehicle, the window having a visible transmission of at least about 30%;
   wherein the coating comprises a first layer located directly on an contacting the substrate, and an anti-etch layer located over and contacting the first layer,
   wherein the anti-etch layer comprises one or more of: silicon carbide nitride, hydrogenated silicon carbide nitride, zirconium oxycarbide, zirconium carbide, hydrogenated zirconium oxycarbide, and/or hydrogenated zirconium carbide.

2. The window of claim 1, wherein the anti-etch layer comprises silicon carbide nitride.

3. The window of claim 1, wherein the window comprises first and second of the anti-etch layers, with at least one additional layer provided therebetween.

4. The window of claim 1, wherein the anti-etch layer comprises hydrogenated silicon carbide nitride.

5. The window of claim 1, wherein the anti-etch layer comprises zirconium oxycarbide.

6. The window of claim 1, wherein the anti-etch layer comprises zirconium carbide.

7. The window of claim 1, wherein the anti-etch layer comprises hydrogenated zirconium oxycarbide.

8. The window of claim 1, wherein the anti-etch layer comprises hydrogenated zirconium carbide.

* * * * *